United States Patent
Koh et al.

(10) Patent No.: US 7,047,174 B2
(45) Date of Patent: May 16, 2006

(54) METHOD FOR PRODUCING TEST PATTERNS FOR TESTING AN INTEGRATED CIRCUIT

(75) Inventors: Alex S. Y. Koh, Austin, TX (US); Alan Joseph Carlin, Austin, TX (US); Kenneth Paul Tumin, Austin, TX (US); Hubert Glenn Carson, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 783 days.

(21) Appl. No.: 09/847,487

(22) Filed: May 2, 2001

(65) Prior Publication Data

US 2002/0163351 A1 Nov. 7, 2002

(51) Int. Cl.
 *G06F 9/455* (2006.01)
(52) U.S. Cl. .................. 703/14; 703/16; 702/117; 714/724; 714/738; 714/739; 714/726
(58) Field of Classification Search .................. 703/13, 703/14, 16; 716/4, 6; 702/117; 714/741, 714/738, 724, 739
See application file for complete search history.

(56) References Cited

U.S. PATENT DOCUMENTS

| | | | |
|---|---|---|---|
| 6,092,225 A * | 7/2000 | Gruodis et al. | 714/724 |
| 6,256,760 B1 * | 7/2001 | Carron et al. | 714/726 |
| 6,295,623 B1 * | 9/2001 | Lesmeister et al. | 714/741 |
| 6,308,292 B1 * | 10/2001 | Fusco | 714/738 |
| 6,370,675 B1 * | 4/2002 | Matsumura et al. | 716/6 |
| 6,438,048 B1 * | 8/2002 | Kumar | 365/201 |
| 6,622,271 B1 * | 9/2003 | Colby et al. | 714/724 |
| 6,625,771 B1 * | 9/2003 | Wright | 714/741 |
| 6,629,277 B1 * | 9/2003 | Sanghani | 714/731 |
| 6,651,225 B1 * | 11/2003 | Lin et al. | 716/4 |
| 6,678,625 B1 * | 1/2004 | Reise et al. | 702/117 |
| 6,708,305 B1 * | 3/2004 | Farnsworth et al. | 714/739 |
| 6,868,513 B1 * | 3/2005 | Botala et al. | 714/738 |
| 6,876,214 B1 * | 4/2005 | Crook et al. | 324/755 |
| 2001/0007972 A1 * | 7/2001 | Araki et al. | 703/16 |
| 2001/0010080 A1 * | 7/2001 | Walter et al. | 713/202 |
| 2002/0073374 A1 * | 6/2002 | Danialy et al. | 714/738 |
| 2002/0112209 A1 * | 8/2002 | Abramovici et al. | 714/744 |
| 2003/0066003 A1 * | 4/2003 | Parvathala et al. | 714/738 |
| 2003/0177426 A1 * | 9/2003 | Bauwens et al. | 714/724 |

* cited by examiner

*Primary Examiner*—Paul L. Rodriguez
*Assistant Examiner*—Kandasamy Thangavelu
(74) *Attorney, Agent, or Firm*—James L. Clingan, Jr.; Joanna G. Chiu

(57) ABSTRACT

A test pattern generation flow has a stimulus and a device under test (DUT) that operate together through a test bench. The test bench monitors and collects all the data necessary to generate a test program. This information is presented as a captured simulation that allows for ease of generating test software, as well as other simulations such as fault simulation and virtual test simulation. The complete and convenient information can be utilized to automate the development and/or easily manually develop and debug the test software.

12 Claims, 3 Drawing Sheets

METHOD FOR PRODUCING TEST PATTERNS FOR TESTING AN INTEGRATED CIRCUIT

FIELD OF THE INVENTION

This invention relates to testing integrated circuits and more particularly for developing test patterns for testing integrated circuits.

BACKGROUND OF THE INVENTION

In the manufacture of integrated circuits, there is a requirement of not just designing the integrated circuit and manufacturing it, but also testing it. The test software for an integrated circuit is desirably available as efficiently as possible. The resources for developing the test software are a limited quantity. Further, the test software should be verified and completely debugged prior to the first silicon of the integrated circuit being available.

Several problems relating to providing the test software make it difficult to achieve the desired timeliness. One is that the techniques used in the first testing of the design are simply for verifying that the design is valid. This verification software is not transferable immediately to the tester. After the design of the integrated circuit has been verified as providing the desired operation, the development of the test software can begin. The process of developing the test software can take months. It may take longer than the time for the first silicon to appear, which is clearly undesirable.

A test pattern generation flow 10 of the prior art, which exhibits these problems, is shown in FIG. 1. A test pattern generation flow 10 comprises a stimulus 12, a device under test (DUT) 14, a test bench 16, a raw dump 18, a raw dump 20, manual processing 22, manual processing 24, tester converter 26, a tester 28, a virtual test simulation 30, and a fault simulation 32. In typical operation DUT 14 is a completed design that is tested by a stimulus 12 using test bench 16. DUT 14 is a device model of the designed integrated circuit, which is in a format that allows it to be verified and simulated.

Stimulus 12 works directly with DUT 14 and also operates on DUT 14 through test bench 16. During this time period, stimulus 12 is testing DUT 14 with respect to a specification that DUT 14 used in its design. The specification may be silent on some issues, may be unclear, or may be untestable. In such case, stimulus 12 may be testing for things that DUT 14 either does not have, or was designed with a different function in mind. These issues are worked out and eventually stimulus 12 and DUT 14 are harmonized.

After agreement has been reached so that stimulus 12 and DUT 14 are harmonized, the design of the test software for testing the ultimate integrated circuit that would be made using the design for DUT 14 is begun. This begins with a raw dump of the data that was used in the development of DUT and in the testing so that test bench 16 and DUT 14 provide raw dump 18 and raw dump 20. Raw dump 18 undergoes manual setup for the purpose of generating the test software. The manual setup that occurs at this step can be very difficult and tedious because the data itself is not complete or conveniently formatted. The data is sufficient, perhaps, for calculations to be made and conclusions to be drawn so that things such as signal direction, signal timing, and whether the signal should be masked can be calculated or derived by reference to the DUT. The need to refer back to the DUT itself may be very difficult and time consuming and may result in errors. This may require communication back to the designers of the DUT 14. Those designers may be on other projects or perhaps not even available. This process alone commonly can often take several weeks.

After this step is complete, tester converter 26 converts this data to a form that is usable by the tester 28. This conversion has several characteristics. One of the most significant of these characteristics is cyclization. The converted data is also used to enable a virtual test simulation 30. Virtual test simulation 30 performs a test on DUT 14 to verify that tester software provided to tester 28 is correct.

Raw dump 20 is substantially the same information as raw dump 18 but is typically in a different format. Manual setup 24 is performed on raw dump 20 to produce a fault simulation 32. Fault simulation 32 is used to grade the performance of the tester software. Thus, fault simulation 32 is operating on substantially the same data provided by test bench 16 and DUT 14 as raw dump 18 but there is a substantial processing difference that occurs. Being in substantially different format, if mistakes are made in either fault simulation 32 or the test software, then it is difficult to correlate the mistake in one to the similar location in the other. Manual processing 24 takes about the same amount of time as manual processing 22 and the debug is also difficult.

Thus, it is seen there is a need for a process for developing test software that does not require so much time, so much manual processing, and so much difficulty in debugging.

DESCRIPTION OF THE INVENTION

A technique combines the use of a stimulus and a device under test (DUT), which is a device model, through a test bench that monitors and controls the contact between the stimulus and the DUT. This provides for the opportunity to capture all the necessary information for automatically generating test software for testing an integrated circuit. The test software is generated in an automated fashion from the output of the test bench. The test bench provides the information categorized in a manner which allows for this automated process of generating the test software. In addition to the test software itself being able to be automatically generated, the virtual test simulation software and fault simulation software can also be automatically generated.

Figure 1:
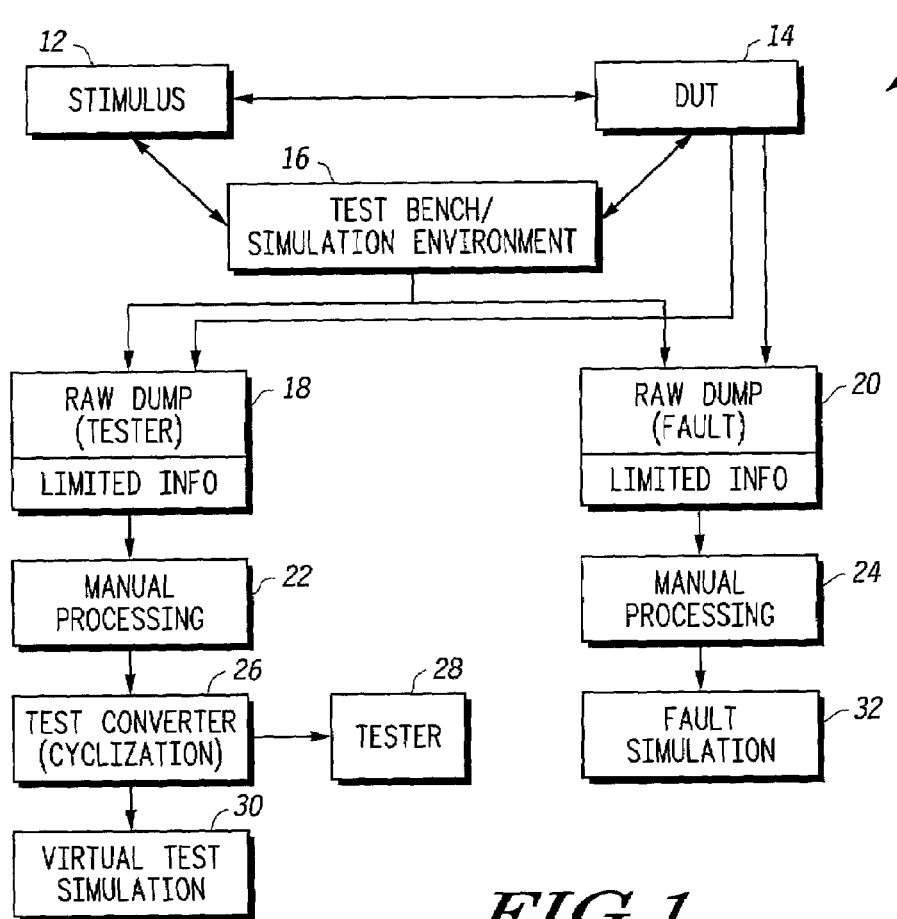
FIG. 1 is a test pattern generation flow according to the prior art.
Figure 2:
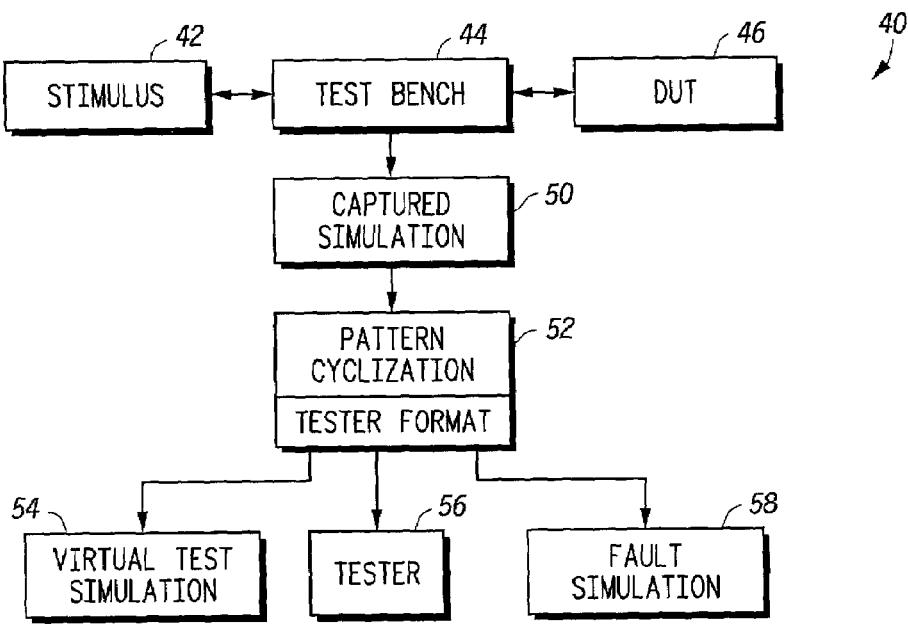
FIG. 2 is a test pattern generation flow according to an embodiment of the invention.

Shown in FIG. 2 is a test pattern generation flow 40 comprising a stimulus 42, a test bench 44, a device under test 46, a captured simulation 50, a pattern cyclization 52, a virtual test simulation 54, an automatic test equipment (ATE) tester 56, and a fault simulation 58. Stimulus 42 is designed to verify the design of DUT 46. By verify it is meant to verify that the DUT 46 is designed to a specification. Stimulus 42 utilizes test bench 44 to verify DUT 46. Test bench 44 operates primarily for providing an interface between stimulus 42 and DUT 46 and capturing all of the relevant transactions.

Captured simulation 50 contains the information collected by test bench 44 which is sufficient for verifying the DUT and generating the test pattern. Thus, after stimulus 42 and DUT 46 have been reconciled, captured simulation 50 contains all the information necessary to generate the test pattern. Captured simulation 50 is then used to develop the pattern cyclization 52. This development of the pattern cyclization is possible to achieve automatically because captured simulation 50 contains all the necessary information. With captured simulation 50 containing, itself, all the necessary information, pattern cyclization 52 is a relatively easy step. Pattern cyclization 52 is a type of data pattern that is necessary for typical testers. Other data patterns may be generated instead depending upon the needs of a tester or the like. Cyclization, in this case can be automated but, even if it is not, it is a relatively easy manual task. In addition to pattern cyclization, a tester format function is performed as well to be in the form necessary to operate tester 56.

After the pattern cyclization, fault simulation data 58 and virtual test simulation data 54 are also automatically generated. The result is a virtual test simulation, tester software, and fault simulation that operate from the same data. Other simulations, which are not shown, such as resimulation, may also be generated from the pattern cyclization. There is little manipulation of the data that occurs that is different from the various simulations except as needed for their different purposes. Fault simulation 50 is for the purpose of evaluating and grading the test software itself. Virtual test simulation 54 is for testing the device model of DUT 46 and verifying and debugging the test software. Tester 56 receives the test software for testing the integrated circuit, itself. Pattern cyclization performs the pattern cyclization for all three purposes but provides the output in a different format appropriate for each of virtual test simulation 54, tester 56, and fault simulation 58.

Virtual test simulation 54, tester 56, and fault simulation 58 are post processing tools. Other examples of post processing tools include a code coverage tool, an Iddq coverage tool, a floating node analysis tool, a power analysis tool, a wave form viewer, and a resimulator. There may be other examples of post processing tools as well.

Figure 3:
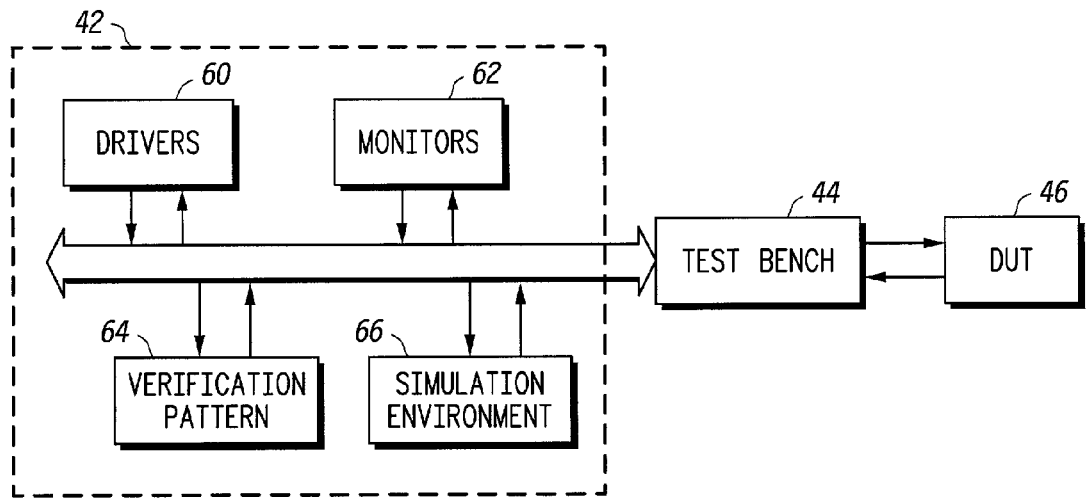
FIG. 3 is a portion of test pattern generation flow of FIG. 2 shown in more detail.

Shown in FIG. 3 is a portion of test pattern generation flow 40 comprised of stimulus 42 in more detail, test bench 44, and DUT 46. Stimulus 42 comprises drivers 60, monitors 62, a verification pattern 64 and a simulation environment 66. The function of the verification pattern is to verify the specification and is at the feature level of DUT 46. Examples of a feature are a read, a write, transfer of data, timing, and protocol. Many integrated circuits would have these functions so that verification pattern 64 will typically have significant commonality from one integrated circuit to another.

Driver 60 provides write operations at a module level, and monitor 62 provides reads and protocol checking at the module level. Thus, drivers 60 and monitors 62, since they operate at the module level, should have substantial repeatability from one integrated circuit to another. To the extent integrated circuits have the same modules, they can have the same drivers and monitors such as drivers 60 and monitors 62. Simulation environment 66 provides DUT specific directions that are necessary for such things as resets and delays. Simulation environment 66 provides the directions specific to DUT 46 that allow for driver 60, monitor 62 and verification pattern 64 to have such a high degree of reuse in them.

Figure 4:
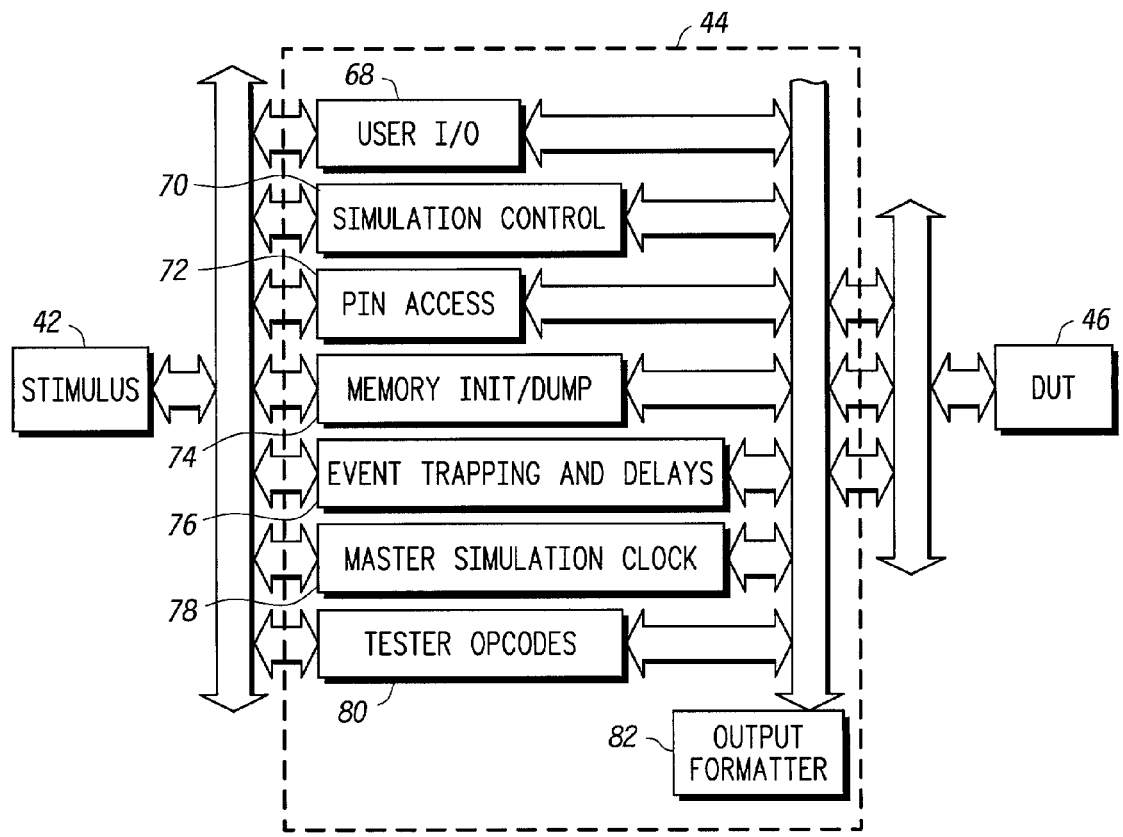
FIG. 4 is another portion of test pattern generation flow shown in FIG. 2 shown in more detail.

Shown in FIG. 4 is a portion of test pattern generation flow 40 comprising stimulus 42, test bench 44, and DUT 46. In this case, details of test bench 44 are shown. As shown in FIG. 4, test bench 44 comprises a user I/O 68, a simulation control 70, pin access 72, a memory initialization/dump 74, an event trapping and delays 76, a master simulation clock 78, tester OPCODES 80, and output formatter 82. Interface commands 68–80 comprise user I/O 68, simulation control 70, pin access 72, memory and initialization/dump (memory INIT/dump) 74, event trapping and delay 76, master simulation 78, and device and tester OPCODES. These interface commands 68–80 record the information generated as a result of the interaction between the stimulus 42 and DUT 46 as well as information generated by stimulus 42 and DUT 46 through test bench 44. Interface commands 68–80 comprise a complete set of information necessary to generate a complete test within a test program. Output formatter 82 captures all of this information. An advantage of test bench 44 is the capturing of all of this information. This is a benefit over systems that do not provide all of this information directly to an output formatter, such as output formatter 82, and reuse of the test bench because it is independent of the DUT.

Figure 5:
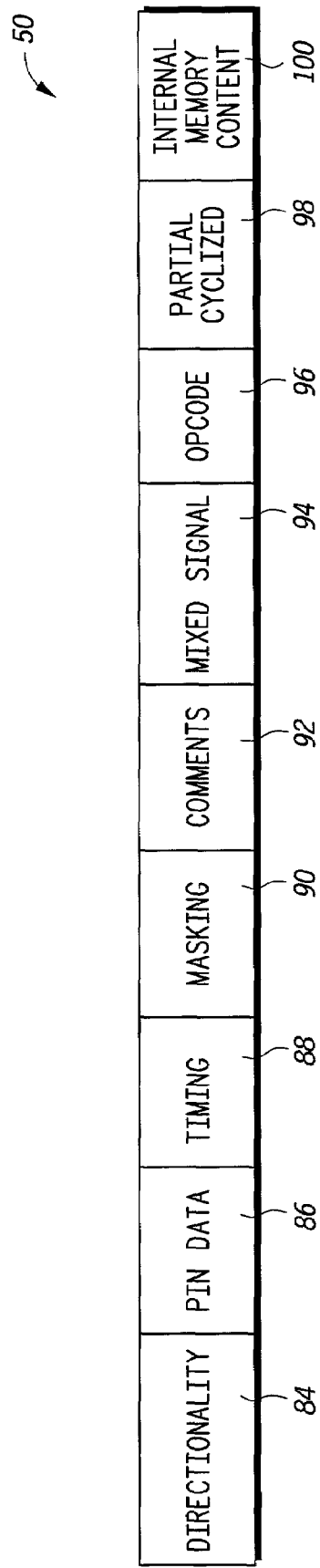
FIG. 5 is yet another portion of the test pattern generation flow of FIG. 2 shown in more detail.

Shown in FIG. 5 is captured simulation 50 in more detail. Captured simulation 50 comprises categories of information comprising a directionality 84, a pin data 86, a timing 88, a masking 90, comments 92, a mixed signal 94, an OPCODE 96, a partial cyclized 98, and an internal memory content 100. These categories of information 84–100 are a complete record of the transactions involving DUT 46 and stimulus 42 and have been categorized in a useful manner. This format of categories of information 84–100 provides for the ability to automate the creation of the test software from stimulus 42 as interacted with DUT 46. This categorization of information 84–100 is also useful for debugging. This is especially true of comments 92.

Directionality 84 provides direct information as to whether a signal is an input or an output. The directionality 84 also provides specific information as to the source of the signal. This has a benefit of conveniently knowing which resource, read or write, is required. This knowledge is essential for proper functioning of the test program. Pin data 86 provides the value at a particular pin, important to proper operation of test software. Timing 88 provides information as to the strobe timing and drive timing, which may be essential to proper operation of the circuit. Having this information can make timing issues much less troublesome. Masking 90 provides information with respect to a signal being an active signal or if it is a signal whose value is not reliable. Knowing that the logic state of a signal is a "don't care" can be very useful. The logic state for a signal under certain processing conditions may differ. If the logic condition was believed to be deterministic, not knowing the signal was actually a "don't care" could result in rejecting the integrated circuit under some circumstances where it was not in fact a reject, and thereby unnecessarily hurt yield. Each of these important categories 84–90 of information can be beneficial then even if the test software is not automatically generated.

Comments 92 provide information about results and reasons for results that can be useful in debug. Mixed signal 94 provides analog voltage magnitudes and precisions. OPCODE 96 provides information about specific device and tester functions that are being called into operation. Partial cyclized 98 provides cyclization information which allows for automated cyclization. Internal memory content 100 provide information regarding the contents of memories internal to DUT 46. This information can include the initial and final state of the internal memories which is important in determining order and dependencies between patterns as well as initialization for the pattern itself. Thus also each of these categories of information 92–96 and 100, which are generated in this case in response to the interaction between DUT 46 and stimulus 42, may also be beneficial even if the test software is not automatically generated.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for testing an integrated circuit, comprising:
   providing a stimulus to a test bench;
   providing a device model corresponding to the integrated circuit to the test bench;
   in response to applying the stimulus to the device model through the test bench, generating captured simulation, the captured simulation comprising strobe timing information, opcode information, mixed signal information, and internal memory content information;
   automatically generating tester software corresponding to the integrated circuit using the captured simulation;
   generating a virtual test software;
   testing the device model of the integrated circuit and debugging and verifying the tester software using the virtual test software; and
   testing the integrated circuit using the tester software.

2. The method of claim 1, wherein the captured simulation captures all communication through the test bench between the stimulus and the device model.

3. The method of claim 1, wherein the stimulus comprises verification patterns, drivers, and monitors.

4. The method of claim 1, wherein the captured simulation further comprises information relating to directionality information, pin data information, masking information, comment information, and partial cyclized information.

5. A method for testing an integrated circuit, comprising:
   generating a captured simulation in response to applying a stimulus to a device model of the integrated circuit, wherein the captured simulation comprises strobe timing information, opcode information, mixed signal information, and internal memory content information, the captured simulation generated in response to stimulus applied to the device model through a test bench;
   generating data patterns based on strobe timing information, opcode information, mixed signal information, and internal memory content information, the data patterns capable of being retargettable for a plurality of post-processing tools;
   generating a first formatted pattern file based on the data patterns;
   automatically generating tester software corresponding to the integrated circuit using the first formatted pattern file;
   testing the device model of the integrated circuit and debugging and verifying the tester software using virtual test software; and
   testing the integrated circuit using the tester software in an automatic test equipment (ATE) tester.

6. The method of claim 5, wherein the captured simulation further comprises information relating to directionality information, pin data information, masking information, comment information, and partial cyclized information.

7. The method of claim 5, wherein the data patterns include cyclized patterns.

8. A testing system for testing an integrated circuit, comprising:
   simulation means for generating a captured simulation in response to applying a stimulus to a device model of the integrated circuit;
   first instruction means for receiving the captured simulation wherein the captured simulation comprises strobe timing information, opcode information, mixed signal information, and internal memory content information, the captured simulation generated in response to stimulus applied to a device model through a test bench;
   second instruction means for generating data patterns based on strobe timing information, opcode information, mixed signal information, and internal memory content information, the data patterns capable of being retargettable for a plurality of post-processing tools;
   third instruction means for generating a first formatted pattern file based on the data patterns;
   fourth instruction means for automatically generating tester software corresponding to the integrated circuit using the first formatted pattern file;
   fifth instruction means for testing the device model of the integrated circuit and debugging and verifying the tester software using a virtual test software; and
   an automatic test equipment (ATE) tester for testing the integrated circuit using the tester software.

9. A testing system for testing an integrated circuit, comprising:
   first instruction means for receiving a stimulus;
   second instruction means for receiving a device model corresponding to an integrated circuit;
   third instruction means for generating simulation parameters in response to applying the stimulus to the device model;
   fourth instruction means for creating captured simulation based on the simulation parameters, the captured simulation comprising strobe timing information, opcode information, mixed signal information, and internal memory content information; and
   fifth instruction means for automatically generating tester software corresponding to the integrated circuit using the captured simulation;
   sixth instruction means for testing the device model of the integrated circuit and debugging and verifying the tester software using a virtual test software; and
   an automated tester means for testing the integrated circuit using the tester software.

10. The testing system of claim 9, wherein the captured simulation captures all communication between the stimulus and the device model through a standard reusable test bench.

11. The testing system of claim 10, wherein all communication with the device model occurs through the standard reusable test bench.

12. The testing system of claim 9, wherein the captured simulation comprises information relating to directionality information, pin data information, masking information, comment information, and partial cyclized information.

* * * * *